United States Patent [19]

Fazel et al.

[11] Patent Number: 5,323,424
[45] Date of Patent: Jun. 21, 1994

[54] MULTISTAGE DECODER

[75] Inventors: Khaled Fazel, Epinay/Orge; Antoine Chouly, Paris, both of France

[73] Assignee: U.S. Philips Corporation, New York, N.Y.

[21] Appl. No.: 859,182

[22] Filed: Mar. 27, 1992

[30] Foreign Application Priority Data

Mar. 29, 1991 [FR] France ................. 91 03851

[51] Int. Cl.$^5$ .............................. H04L 27/18
[52] U.S. Cl. ......................... 375/83; 375/17; 371/37.1
[58] Field of Search ............ 375/17, 18, 83, 94, 375/104; 371/6, 37.1

[56] References Cited

U.S. PATENT DOCUMENTS 4,283,682 8/1981 Sifford et al. ................. 375/81
4,928,288 3/1980 D'Aria et al. ................. 375/17

FOREIGN PATENT DOCUMENTS

WO91037 3/1991 PCT Int'l Appl.

OTHER PUBLICATIONS

"Multilevel Codes Based on Partitioning", IEEE Transactions on Information Theory, vol. 35, No. 1, Jan. 1989, pp. 87-98.
"Channel Coding with Multilevel/Phase Signals", IEEE Transactions on Information Theory, vol. IT-28, No. 1, Jan. 1982, pp. 55-67.

Primary Examiner—Stephen Chin
Assistant Examiner—T. Ghebretinsae
Attorney, Agent, or Firm—Michael E. Marion

[57] ABSTRACT

A multistage decoder for decoding received symbols formed by symbols which have been subjected to multilevel coding in several successive partitioning levels from a constellation into several subsets. A symbol of the constellation is coded into several bits, and each stage of the multistage decoder determines a sequence of bits relative to a partitioning level for a sequence of estimated symbols which are selected from among the symbols of the constellation or of the subset as being each individually closest to the received symbols. The invention is characterized in that for at least one stage at least one detector generates an erasure bit for the estimated symbols whenever a received symbol lies in a predetermined erasure zone, whereupon the stage decoder then corrects the erasure bits. The decoder may operate in the adaptive or non-adaptive mode. The erasure zones may be angular sectors or bands of constant width. The widths of the zones are stored in pre-programmed memories.

12 Claims, 8 Drawing Sheets

MULTISTAGE DECODER

BACKGROUND OF THE INVENTION

The invention relates to a multistage decoder for decoding received symbols coded into blocks formed by symbols which are consecutively emitted after having undergone a multilevel coding according to several successive partitioning levels from a constellation into several subsets during an emission, a symbol of the constellation being coded by means of several bits, while each stage of the multistage decoder determines a sequence of bits relative to a partitioning level for a sequence of estimated symbols which are selected from among the symbols of the constellation or the subset as being each individually the closest to the received symbols, a stage comprising decision means followed by a stage decoder and being validated in cascade fashion by the outputs of the preceding stages in the order of succession of the said levels.

Such a decoder is used in the transmission of digital signals through a transmission channel.

This may relate to the transmission of digital television signals, for example high-definition, through a satellite channel, or digital signals through radio beams. It may alternatively relate to the transmission of sound by mobile radio, or digital data to be stored, for example, in a Compact Disc or digital video recorder. In these cases, it is necessary to carry out a preliminary reduction of the output rate at the source by a source encoder during the emission, and to re-establish the output rate at the receiving end by means of a source decoder. This rate reduction by a source encoder is not necessary in the case in which digital data are to be transmitted between two digital processing units, for example, between two calculators.

Since the most representative application is that of high-definition television (HDTV), for which the problems are the most wide-ranging, the present Patent Application is drawn up with reference to this technical application without any limitation whatsoever being implied thereby.

The digitization of high-definition television (HDTV) signals involves a total gross output rate of the order of 800 Mbits/s. The transmission of such information with such an output rate cannot be economically realised through existing transmission channels. Several coding techniques for reducing the output rate (source coding) have been developed. The performance levels of these coding algorithms are measured in terms of their "reduction factor" of the output rate and the quality of the restored image after decoding. The more the redundancy of the signal is reduced, the more the transmitted information is significant. Possible transmission errors which may be corrected fairly easily when the transmitted information is redundant have consequences of increasing gravity in proportion as the reduction factor increases.

As a result, the transmission of digital HDTV signals necessitates a suitable protection. If the effects of transmission errors should not be visible on a screen, the error rate per line must be lower than $10^{-11}$.

The channel used for "Direct Broadcasting by Satellite" (DBS) has the following characteristics:
a bandwidth of 27 MHz,
a low power (especially for the signal coming from the satellite) and the presence of a high noise level, which can be considered as additive, white and Gaussian, and
non-linear distortions.

The transmission of digital HDTV signals through such a channel requires a source coding with a considerable degree of compression as well as a digital modulation with a high spectral efficacy.

The source coding techniques, for example, based on an orthogonal transformation, are capable of reducing the output level by a factor 10 while still providing a good quality of the restored image. This leads to the transmission of a binary output of the order of 70 Mbits/s. However, the transmission of such signals through a satellite channel requires a digital modulation with a spectral efficacy of up to 3 bits/s/Hz.

Furthermore, it is necessary to carry out a channel coding to protect the transmission from the imperfections of the channel. The classical coding and modulation techniques are found to have their limitations as regards full compliance with the requirements of a correct transmission (in these techniques, the coding function is regarded as an entity which is independent of the modulation function). The coding techniques, however, have been considerably improved thanks to the coding technique proposed by G. UNGERBOECK in the article "Channel Coding with Multilevel/Phase Signals" published in IEEE Transactions on Information Theory, vol. IT-28, no. 1, January 1982, pp. 55–67.

It is proposed to consider the channel coding and the modulation as one entity and to combine for this purpose a channel coding with a digital modulation. This renders it possible to increase the efficacy of the digital transmission, so to improve the performance, without sacrificing the spectral efficacy. The additional redundancy induced by the coding is transmitted through the redundancy of the alphabet instead of diminishing the data rate. This technique is based on the principle of maximizing the minimum Euclidean distance between the sequences of transmitted coded symbols.

Thus, after a coding step which transforms p bits of information into m bits, with $m > p$, in which $m - p$ represents the added redundancy for information protection during transmission, with a modulation of $2^m$ states, there are $2^{m-p}$ extra states available for transmitting this redundancy. This modulation technique renders it possible to carry out a spatial, not temporal partitioning of the redundancy.

Following the discovery by G. UNGERBOECK, trellis-coded modulations (TCM), block-coded modulations (BCM) and multidimensional trellis-coded modulations have been proposed.

TCM of medium complexity (4 or 8 states) are capable of providing a coding gain of 3 to 4 dB. For large-scale applications, however, the addition of a Viterbi decoder necessary for decoding these TCM remains expensive with present-day technology. An attractive coding technique for these applications is that of multilevel coding. The interest of this technique lies in that it is adapted to a simple process of sub-optimal decoding which takes place in steps and offers a good compromise between performance and implementing complexity.

Based on the set partitioning principle as disclosed by G. UNGERBOECK, the use of multilevel coding has been analyzed in particular by G. J. POTTIE and D. P. TAYLOR in "Multilevel Codes Based On Partitioning" IEEE Trans. Information Theor., vol. 35, no. 1, January 1989, pp. 87–98.

In their article, these authors first of all analyze the principle of multilevel coding which consists in partitioning a constellation and coding the symbols of the constellation, and secondly define a multistage encoder, a coding stage being assigned to a partitioning level, while the symbols are transmitted in blocks through a transmission channel.

At the receiving end, a multistage decoder carries out the inverse operation and restores the symbols corresponding to the emitted symbols. In a classical decoder, this involves decision operations which estimate the symbols and determine bits for the codes of the estimated symbols as a function of the phase and the amplitude detected at the receiving end for each received symbol. Depending on the various transmission and reception conditions, some of the estimated bits are incorrect. A first stage of the multistage decoder takes decisions at the first partitioning level. The result delivered by this first stage is used for enabling the operation of the second stage, and so on, until the last stage. In the article by G. J. POTTIE and D. P. TAYLOR, a supplementary concept of erasure is introduced, which takes place after each decoding of a stage, in a concatenated decoding operation. This improves the performance of the decoder, but at the price of an increased complexity. In fact, this necessitates the addition of a second decoder for correcting the errors and filling up the erased positions.

SUMMARY OF THE INVENTION

The invention has for its object to increase also the performance of classical decoding while maintaining an equivalent complexity of the material resources. This improvement in performance is to consist in a reduction of the signal-to-noise ratio at the emission end, for a given error rate of the binary data, which accordingly renders possible a reduction of the emission power.

According to the invention, this object is achieved in that for at least one stage the decision means generate an erasure bit for the estimated symbols whenever a received symbol is situated in a predetermined erasure zone in relation to the subset considered by the relevant stage, the stage decoder then correcting the erasure bits and any error bits present so as to deliver corrected decoded blocks.

An improved performance is thus advantageously obtained without an increase in the material complexity of the multistage decoder, for example, in the case of phase-shift keying (PSK) or quadrature amplitude modulation (QAM).

According to the invention the received symbol should be detected where it is situated in relation to the erasure zones. If the received symbol is situated inside an erasure zone, the bit estimated by the stage for the symbol received is erased, i.e. its value is neither 0 nor 1. If this position is outside an erasure zone, the bit estimated by the stage for the received symbol is accordingly set for either 1 or 0, depending on the code of the nearest symbol belonging to the constellation or subset.

According to a non-adaptive embodiment, the decision means for at least one stage comprise a memory which is programmed so as to assign to an estimated symbol:
  either the erasure bit,
  or the bit of the symbol closest to the received symbol, depending on whether the received symbol is or is not situated in an erasure zone.

According to an adaptive embodiment, the decision means comprise for at least one stage:
  a detector which supplies a bit of the said estimated symbol for each received symbol,
  a comparator which compares the sequence of positions of the estimated symbols with at least one boundary position which defines the erasure zones,
  an erasure generator
    which erases the bit of the estimated symbol when the estimated symbol is inside the said erasure zones, and
    which maintains the said bit of the estimated symbol when the said estimated symbol is outside an erasure zone,
  a counter which counts the number NE of erasure bits of a block of estimated bits,
  an adaptation member which, if the number NE is higher than a limit value q, modifies the boundary position of the comparator so as to reduce the width of the erasure zones, and which maintains the boundary position in the opposite case.

The multistage decoder according to the invention can operate with coded modulations of various types. These may be PSK modulations, QAM, or other modulations. In the case of PSK, the symbols of the constellation have the same amplitude but differ by their phases. The erasure zones are accordingly preferably distinguished by their phases. In that case, the plurality of boundary positions is a plurality of boundary phases in the treatment of PSK modulations, the predetermined erasure zones which are defined in the subsets of the $j^{th}$ partitioning level being formed by angular sectors defined by a phase spacing $\epsilon_{j+1}$ around the phase angle corresponding to the separating bisectors in the constellation or in the subsets between every two adjoining symbols.

In the case of QAM, the symbols are phase-modulated (I) and in quadrature (Q). The erasure zones are accordingly preferably distinguished by means of bands. In the treatment of QAM, the plurality of boundary positions is defined by a distance relative to each symbol of the constellation, the erasure zones of the constellation or of a subset of a partitioning level of the $j^{th}$ order being formed by bands having a width $2a_{j+1}$ centred on the centrelines separating every two adjacent symbols belonging to the same subset.

When a stage relates to a high partitioning level in the case of PSK modulations, however, it may be preferable to distinguish erasure zones for this high level other than by phases. A distinction by a degree of distance is found to be preferable. In that case, at least one stage operates with angular erasure sectors and at least one other stage operates with erasure bands. Similarly, also in the case of PSK modulations, the transmission channel may be subject to a fading effect which changes the amplitude of the signals received. It is then desirable to have available in addition a distinction of the erasure zones by a measure of amplitude. In this case, at least one stage operates simultaneously with angular erasure sectors and with an erasure zone of constant amplitude centred on the origin.

DESCRIPTION OF THE DRAWINGS

The invention will be better understood by means of the following FIGURES, which are given by way of example only, and which represent.

DETAILED DESCRIPTION OF PREFERRED EMBODIMENTS OF THE INVENTION

Figure 1A:
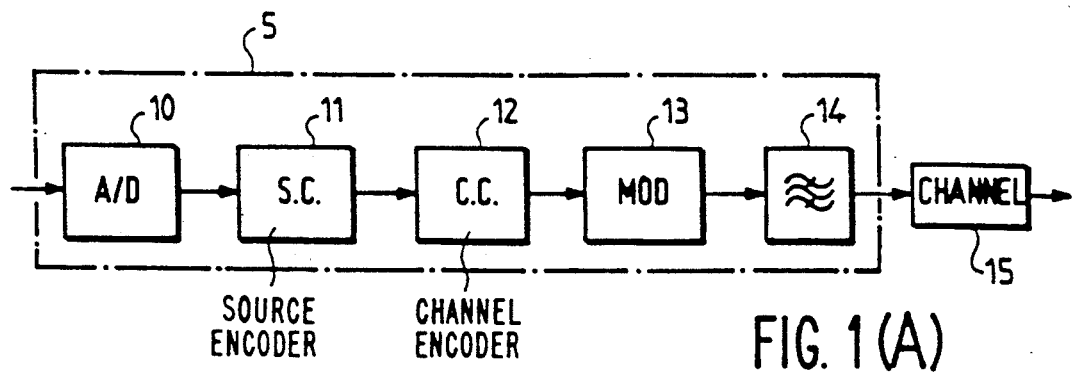
FIG. 1A: a block diagram of a coding system for digital signals.

FIG. 1A represents a block diagram of a coding device 5 for digital signals such as is present at the emission end of a transmission chain. It comprises in series:
- a source 10, for example, an analog-digital converter, which supplies the digital signals to be coded if these are not yet available in digital form,
- a source encoder 11 (which may not exist),
- a channel encoder 12,
- a modulator 13,
- an emission filter 14.

The coding device is connected to the transmission channel 15. This may relate to radio links or cable links.

In an application involving transmission of HDTV signals with a binary output of video signal samples of 864 Mbits/s, this binary output rate is reduced to 70 Mbits/s at the output of the source encoder 11. These samples are coded by the channel encoder 12 to render them invulnerable to channel imperfections. The modulator 13 then adapts the digital samples to the transmission channel, for example, a satellite link.

Figure 1B:
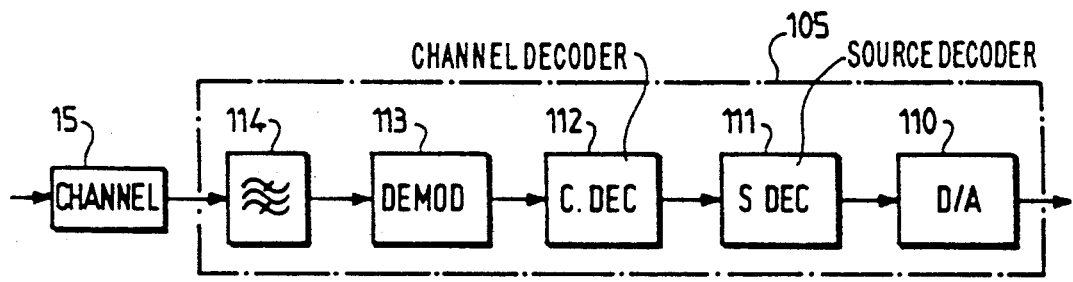
FIG. 1B: a block diagram of a decoding system for digital signals.

FIG. 1B shows the block diagram of a decoding device 105 which carries out operations at the receiving end which are the inversion of those carried out at the emission end. For this purpose, it comprises (at the output of the channel 15):
- a receiving filter 114,
- a demodulator 113,
- a channel decoder 112,
- a source decoder 111 (which may not exist),
- a digital-analog converter 110 if the digital signals are used in analog form.

The coding device 5, the decoding device 105 and the transmission channel 15 constitute a coding/decoding system for digital signals with coded modulation.

CODING

The invention relates to the channel decoding which is the inverted operation of the channel coding carried out at the emission end. The channel coding to which the invention relates is a multilevel coding. The principle of multilevel coding is first explained for reasons of clarity.

Let us consider a constellation $A_0$ with $2^m$ symbols capable of providing the transmission of m bits per symbol. If M ($M \leq m$) indicates the number of bits to be coded, the constellation $A_0$ is partitioned into M levels, thus yielding $2^M$ subsets. The principle of this partitioning is identical to that defined by G. UNGERBOECK. The principle maximizes the minimum Euclidean distance in the subsets of the partitioning. If the minimum Euclidean distance in the subsets obtained at the $i^{th}$ partitioning level is indicated by $d_i$, the following inequality is to be verified:

$$d_0 < d_1 < d_2 < \ldots < d_M$$

in which $d_0$ is the minimum distance in $A_0$.

Figure 2A:
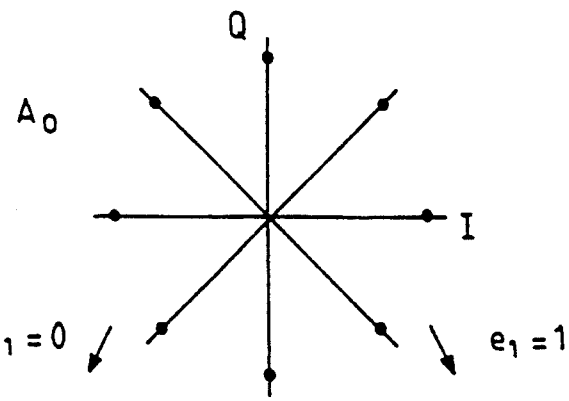
FIGS. 2A, 2B, 2C, 2D: a constellation PSK-8 $A_0$ and its three partitioning levels.
Figure 2B:
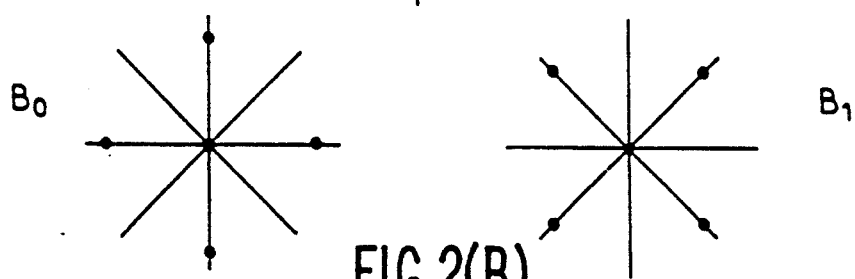
Figure 2C:
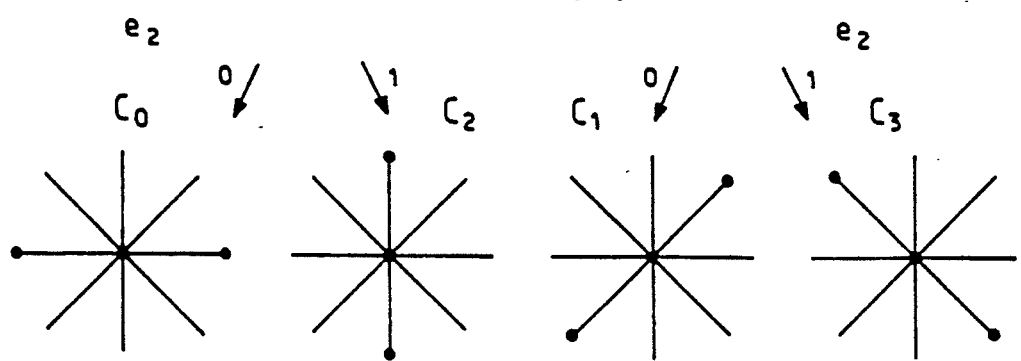
Figure 2D:
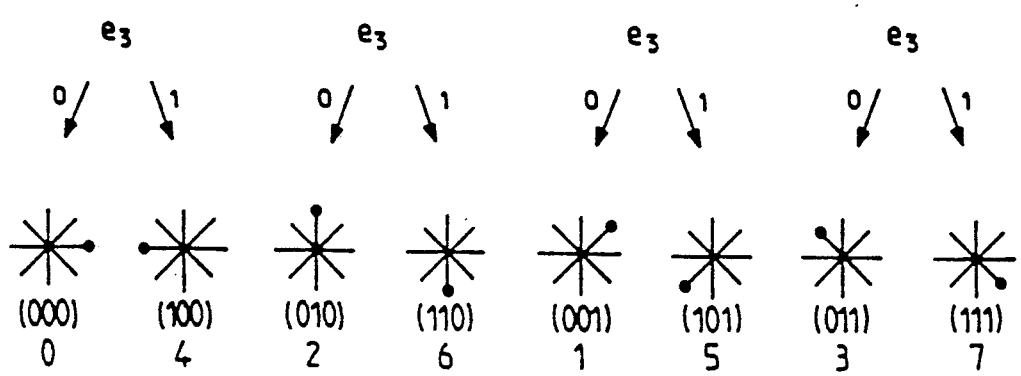

Thus, the M bits $e_1, e_2, \ldots, e_i \ldots, e_M$, ($e_i$ being the bit assigned to the $i^{th}$ partitioning level) select one of the $2^M$ subsets, and the m−M remaining bits indicate a symbol in the selected subset. FIG. 2 shows the partitioning diagram for a PSK-8 modulation. The constellation $A_0$ (FIG. 2A) is partitioned (FIG. 2B) first into two subsets $B_0$, $B_1$ with a minimum distance $d_1$, with $e_i = e_1 = 0/1$ ($e_1 = 0$ for $B_0$ and $e_1 = 1$ for $B_1$), and then (FIG. 2C) into four subsets $C_i$, $i \in \{0, 1, 2, 3\}$ with a minimum distance $d_2$, with $e_i = e_2 = 0/1$ ($e_2 = 0$ for $C_0$ or $C_1$ and $e_2 = 1$ for $C_2$ or $C_3$), and finally into 8 subsets D (FIG. 2D). A subset then is formed by one point. We have $d_0 < d_1 < d_2$.

Figure 3:
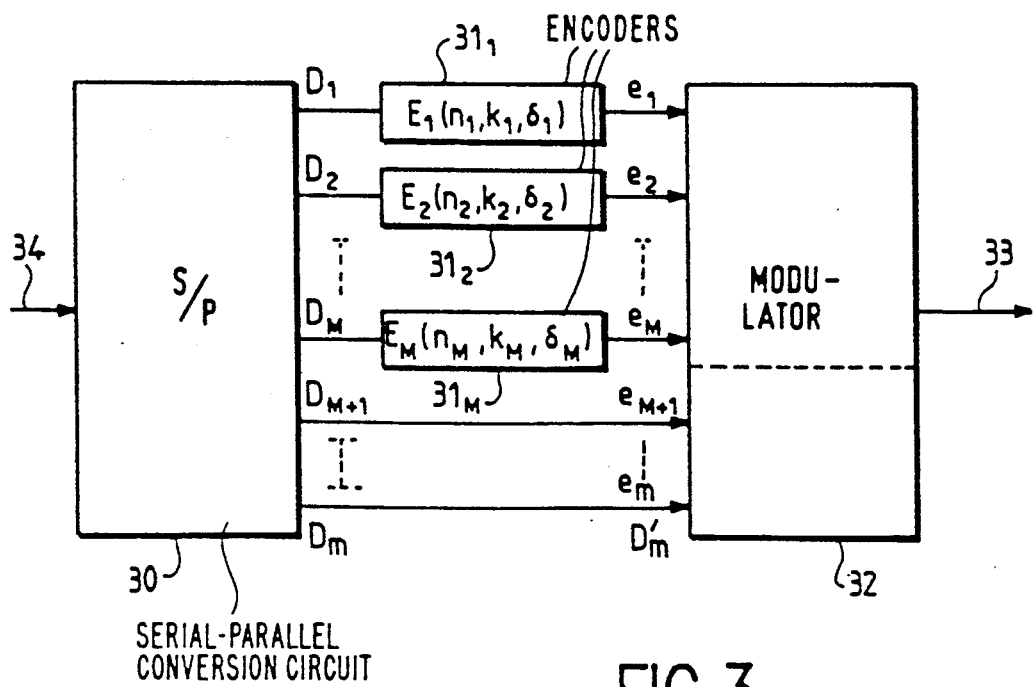
FIG. 3: a diagram of a classical multistage encoder.

This process of assigning the symbols of the constellation has for its object to classify the m bits which correspond to the emitted symbol as a function of their vulnerability to noise. It is very easy to see that the bit $e_2$ is less vulnerable than the bit $e_1$ because it is associated with a minimum Euclidean distance $d_1 > d_0$. According to the partitioning principle described above, it can be demonstrated that, if the bits $e_k$, $k \leq i-1$, are sufficiently protected so as to be correct, the bit $e_i$, $k < i \leq M$, is better protected from noise than all the other bits $e_j$, $j < i$, and that the (m−M) final bits are the least vulnerable. This means that it is better to code these bits separately with different codes and not to carry out a classical serial coding in which all the bits are protected in the same manner from channel noise. The multilevel coding principle partitions the constellation $A_0$ into M levels and then uses M encoders $E_i$, $i = 1, \ldots, M$, to protect these M bits with several protection levels. The diagram of this encoder is shown in FIG. 3. The data stream to be transmitted (connection 34) with output rate D is divided into m streams with rates $D_i$, $i = 1, \ldots, M$, in the element 30. The M first streams are coded by M binary codes $E_i(n_i, k_i, \delta_i)$, $i = 1, \ldots, M$, with an efficacy $R_i = k_i/n_i$ in which $n_i$ represents the number of bits transmitted per block, $k_i$ represents the number of information bits transmitted per block, and $\delta_i$ represents the minimum Hamming distance. At the input of the modulator, the m binary streams must be synchronous with a rate of D'/m. An equivalent coding rate R may thus be defined, given by:

$$R = D/D'$$

Supposing that all codes $E_i$ have the same length, with $n_i = n$, and that the M codes $E_i$ are block codes, it is possible to describe this coding by means of a matrix structure identical to that used for block code modulation (BCM). A code word contains n symbols and may be represented by a matrix G having m lines and n columns in which the $j^{th}$ column represents the binary equivalent of the $j^{th}$ symbol of the block, and the $i^{th}$ line represents the bits assigned to the $i^{th}$ partitioning level. The line i, i=1, ..., M, is a code word of $E_i (n_i, k_i, \delta_i)$ and the (m−M) last lines contain the non-coded bits. With, for example, three partitioning levels in the case of a PSK-8 modulation, we have:

$$G = \begin{vmatrix} e_1^1 \, e_1^2 \, \ldots \, e_1^{k1+1} \, e_1^{k1+1} \, \ldots \, e_1^n \\ e_2^1 \, e_2^2 \, \ldots \, e_2^{k2} \, e_2^{k2+1} \, \ldots \, e_2^n \\ e_3^1 \, e_3^2 \, \ldots \, e_3^{k3} \, e_3^{k3+1} \, \ldots \, e_3^n \end{vmatrix}$$

The bits of one column, for example $e^1{}_1, e^1{}_2, e^1{}_3$, form a symbol $r^1$. Generally, it is easy to see that the minimum Euclidean distance d of this multilevel coding is given by:

$$d^2 = \min(\delta_i \cdot d^2{}_{i-1}) \text{ with } i=1, \ldots, M+1$$

and $\delta_{M+1}=1$. (Non-coded bits). Therefore, the bit $e_1$ is most in need of protection, then $e_2$, etc.

The multilevel coding (FIG. 3) is carried out by means of a serial-parallel conversion circuit 30 which transforms the serial data with data rate D into parallel data with rates $D_1, D_2, \ldots, D_m$. The M first binary streams are coded by the encoders $31_1, 31_2, \ldots, 31_M$ which supply the binary coded data $e_1, e_2, \ldots, e_M$. A selection member 32 ensures that to each word $(e_1, e_2, \ldots, e_m)$ is assigned the code of a symbol of the constellation containing $2^m$ symbols, which signal is emitted by the modulator (connection 33).

By way of example, in the case of PSK-8 with m=M=3, coding may consist in that the $k_1$ information bits are coded by a systematic cyclical binary encoder $E_1$ which has as its generating polynomial $g_1(x)$, for a minimum distance $\delta_i = 10$. This code is capable of correcting up to t=4 errors and filling up to f=9 erasures.

The $k_2$ other information bits are coded by another systematic cyclical binary encoder $E_2$ which has for its generating polynomial $g_2(x)$, for a minimum distance $\delta_2 = 4$. This code is capable of decoding all words having 3 erasures or one error.

The $k_3$ last bits are coded by a parity encoder with a generating polynomial $g_3(x)$, for a minimum distance $\delta_3 = 2$, which is capable of filling up one erasure.

The generating polynomials $g_1(x), g_2(x), g_3(x)$ may be obtained from the document "Error Correcting Codes" by W. W. PETERSON and E. J. WELDON, M. I. T. Press, 1972, Cambridge Mass. (USA), pp. 493–534.

DECODING

Classical Decoding

Figure 4:
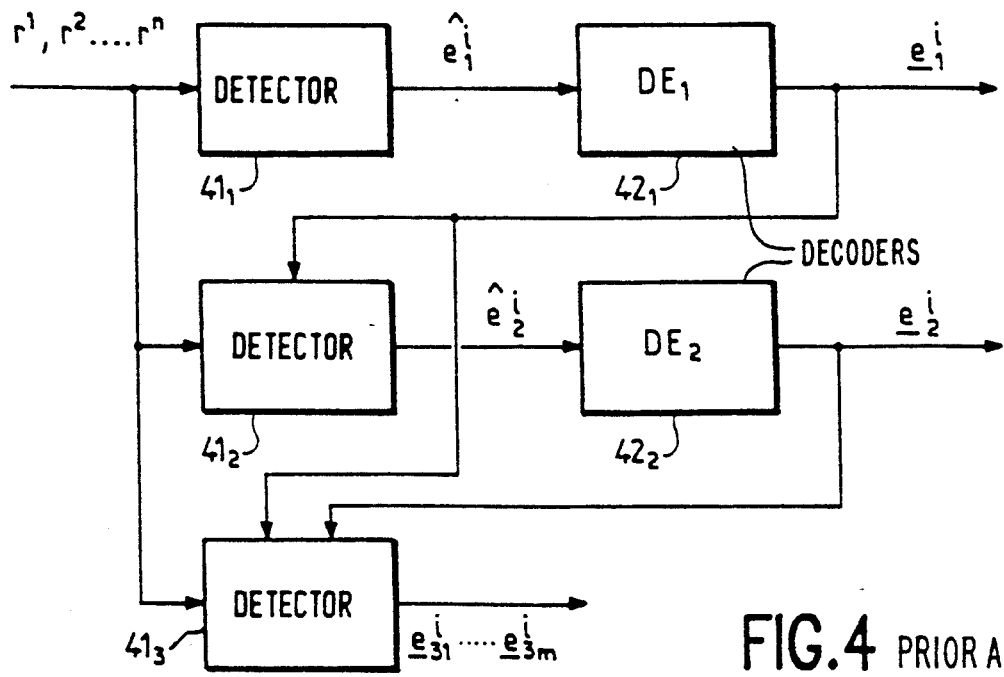
FIG. 4: a diagram of a classical multistage decoder.

Classical optimal decoding involves the application of the criterion of maximum probability to the blocks of received symbols. Unfortunately, this type of decoding can be very complicated. According to the invention, therefore, the sub-optimal decoding technique with successive stages is used, which renders a very simple implementation possible. According to this known technique, each bit $e_i$ is decoded independently by a simple decoder $DE_i$ operating by hard decisions (binary decisions 0/1), but where the output of the decoder $DE_i$ may apply a correction to the bits at the input of the decoder $DE_{i+1}$. FIG. 4 shows the block diagram of this type of classical decoder for the case in which M=2. Given the block of n symbols $(r^1, r^2, \ldots, r^n)$ received at the input of the decoder, the decoding operation runs as follows:

1. Detection of the n bits $e^i{}_1$, i=1, ..., n corresponding to the first partitioning level of $A_0$ (detector $41_1$). A hard decision in $A_0$ is achieved for all $r^1$, i=1, ..., n. A first estimate of $e^1{}_1$, written $ê^i{}_1$, is thus obtained. Decoding on the basis of hard decisions (decoder $42_1$) as to $ê^i{}_1$ provides a final estimate written $e^i{}_1$ for the first stage.

2. Detection of the n bits $e^i{}_2$, i=1, ..., n corresponding to the second partitioning level of $A_0$ (detector $41_2$). As a function of the n bits $e^i{}_1$, a second detection operation (detector $41_2$) is carried out on the symbols $r^i$, i=1, ..., n in the subsets $B_0$ or $B_1$. The decision is taken in $B_0$ or in $B_1$, depending on the value of the bit $e^i{}_1$:
   if $e^i{}_1 = 0$, the decision is taken in $B_0$
   if $e^i{}_1 = 1$, the decision is taken in $B_1$.
   The bits $ê^i{}_2$, i=1, ..., n thus obtained are decoded by the decoder $42_2$ so as to give a final decision $e^i{}_2$.

3. Decoding of the remaining non-coded bits: starting with the bits $e^i{}_1, e^i{}_2$, a third detection of $r^i$ is carried out in the subsets of the second partitioning level of $A_0$. This renders it possible to obtain an estimate of the m-2 non-coded remaining bits for each of the symbols $r^i$, i=1, ..., n.

Decoding according to the Invention

The invention applies this known principle in a modified manner. In fact, according to the invention, the detectors $41_1, 41_2, 41_3$ are provided with decision means which render possible the introduction of erasure bits into the bit sequences $ê^i{}_1, ê^i{}_2, ê^i{}_3$.

The stage decoders $DE_1, DE_2 \ldots$ (FIG. 4) associated with each decoding level of the classical system are "error correctors". These decoders are capable of correcting up to $t_i$ errors, $t_i$ being equal to the integer component of $(\delta_i - 1)/2$. The correction capacity of these decoders is now augmented through the introduction of erasures at the moment of detection.

A symbol in a received block is considered "erased" if this symbol does not belong to the dictionary of the coded block. In the binary case, an erased bit is then neither "0" nor "1". The decoder can then easily detect an erased bit (its position is known) and determine it. This erasure may be introduced at will through the definition of an uncertainty on the symbols of the received word.

The decoders $DE_i$ associated with the respective encoders $E_i$ are capable of correcting t errors and at the same time filling up f erasures. The following inequality is verified:

$$\delta_i \geq 2t + f + 1.$$

For an efficient use of the principle of erasure, uncertainty zones are introduced into the constellation and the subsets. If the received symbol falls into these zones, the bit corresponding to this symbol is considered "erased". Outside these zones, on the other hand, the decisions can be "0" or "1". Each decoder $DE_i$ then corrects any errors existing after decisions which are certain and fills up any erasures existing after decisions which are "uncertain" (erasure). This procedure thus leads to an increase in the efficacy of the multistage decoder, given a good choice of the surface areas of the uncertainty zones.

Figure 5A:
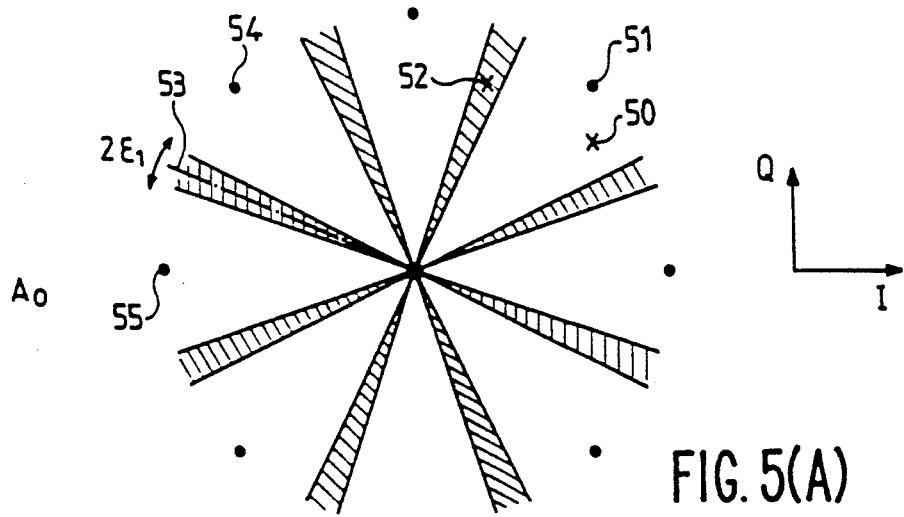
FIGS. 5A, 5B, 5C: erasure zones for the constellation $A_0$ and for the subsets of a PSK-8 modulation according to the invention.
Figure 5B:
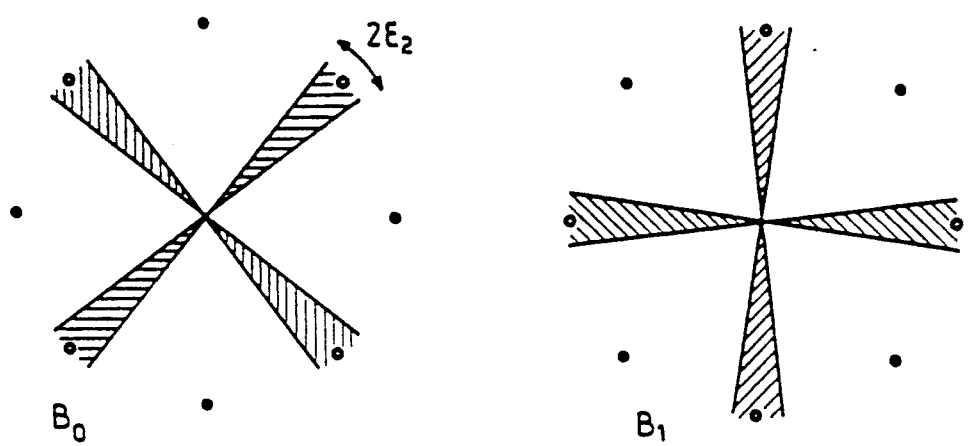
Figure 5C:
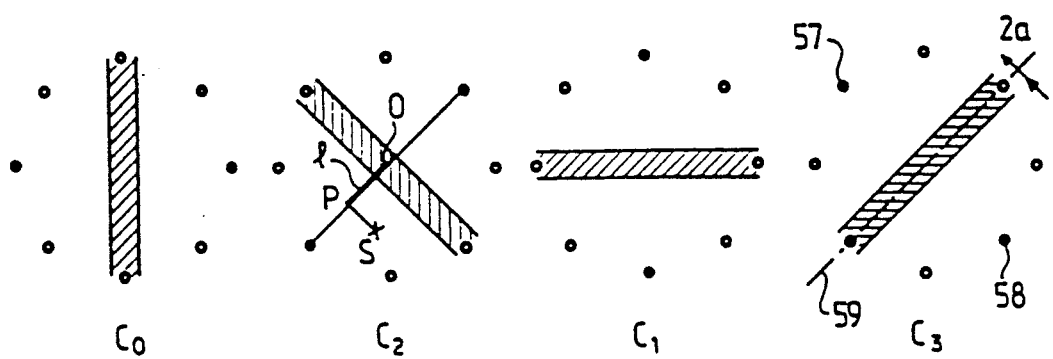

FIGS. 5A, 5B, 5C show a constellation of a PSK-8 modulation by way of example. FIG. 5A shows the constellation $A_0$ arranged in a system of coordinates I and Q for the signal components which are in phase and in quadrature, respectively. The constellation $A_0$ comprises 8 symbols. According to a possible embodiment of the invention, angular sectors of $2\epsilon_1$ are defined situated at $\pm\epsilon_1$ on either side of the phase angle corresponding to each bisector, for example 53, which separates adjoining states 54, 55 of the constellation. In FIG. 5A, the erasure zones are hatched. If a received symbol is located, for example, in position 50, the estimated symbol belonging to $A_0$ which will be assigned to it will be the symbol 51, which is the nearest symbol. The bit $e_1$ which will be attributed to the estimated symbol, i.e. which will be regarded as detected by the stage, will be that bit, 0/1, which corresponds to the first bit $e_1$ of the code of the symbol 51. This is the bit which corresponds to the first partitioning level $A_0$: it is 0 if the estimated symbol belongs to $B_0$ and it is 1 if it belongs to $B_1$. If a received symbol is located inside an erasure zone, for example in position 52, the detected bit will be erased, i.e. it will be neither 0 nor 1. A similar mechanism is put into action for the second stage. Each subset $B_0$, $B_1$ comprises 4 symbols represented by points. There are 4 angular sectors of a width $2\epsilon_2$ in each of the subsets $B_0$ and $B_1$ (FIG. 5B).

For the subsets corresponding to the second partitioning level (FIG. 5C), it is also possible to define erasure zones as angular sectors as defined above. Preferably, however, a definition of the erasure zones is opted for which uses bands of constant width. Each subset $C_0$, $C_1$, $C_2$, $C_3$ of the second partitioning level comprises only two symbols from the constellation. A subset of the second level, for example $C_3$, comprises two neighbouring symbols 57, 58. The erasure zones are formed by bands centred on the centreline 59 which separates these two neighboring symbols 57, 58. This band has a width "$2a$". The decisions of the detectors are taken with due reference to the output bits of the preceding stages.

Figure 6:
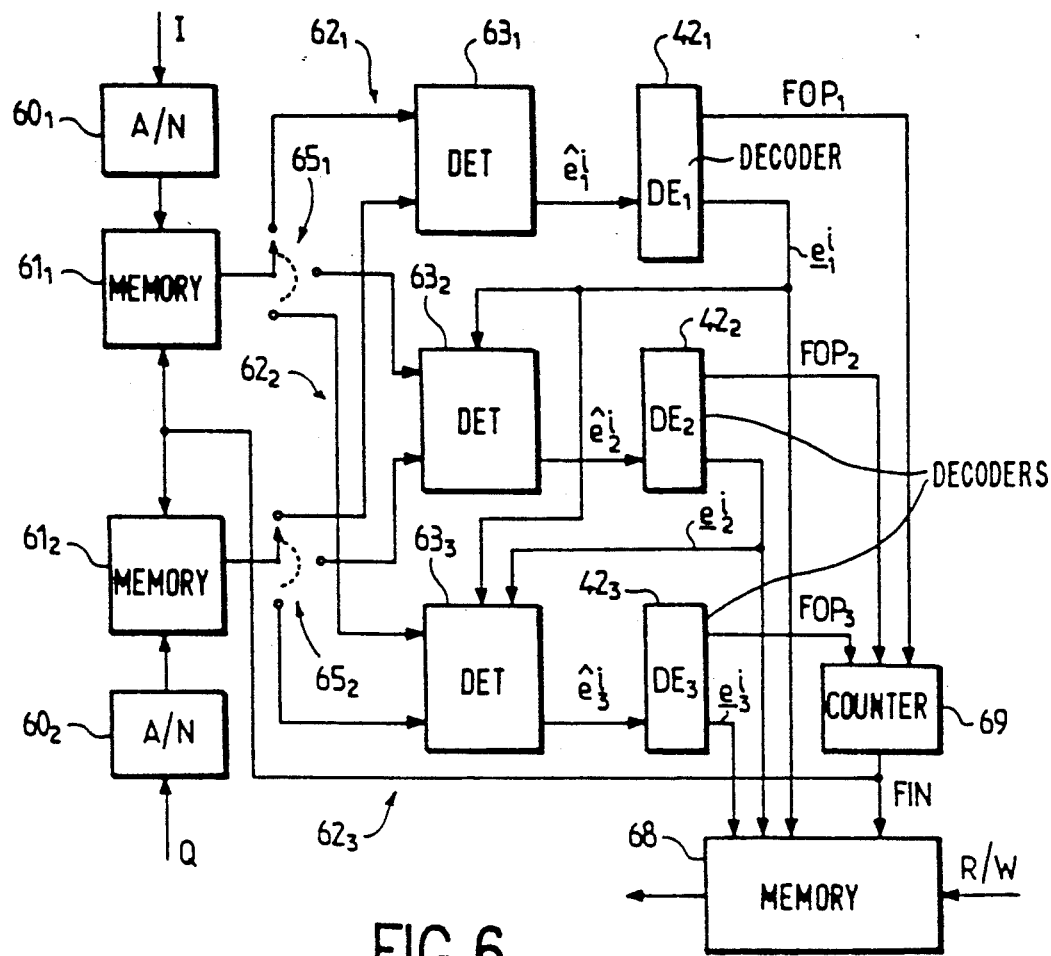
FIG. 6: a diagram of a non-adaptive embodiment of a multistage decoder according to the invention.

The diagram of the decoder according to a non-adaptive embodiment of the invention, is shown in FIG. 6. The phase signals I and quadrature signals Q coming from the demodulator 113 (FIG. 1B) are digitized in two analog-digital converters $60_1$, $60_2$. Blocks of symbols derived from the paths I and Q are stored in two memories $61_1$, $61_2$ so as to permit the decoders (error correctors) to operate block-wise.

The example of FIG. 6 relates to a multistage decoder having 3 stages $62_1$, $62_2$, $62_3$ acting on the constellation and on two successive partitioning levels. Each of the three stages comprises decision means formed by detectors $63_1$, $63_2$, $63_3$ which detect whether the received point is:
  either outside an erasure zone, in which case a decision is taken which assigns either 1 or 0 to the bit detected by the stage,
  or inside an erasure zone, in which case the said bit is put in the erased state.

The three stages operate in succession:
  stage $62_1$ acts on the constellation $A_0$. The detector $63_1$ detects the bit $e^i{}_1$ for the $i^{th}$ symbol of the block. The block of bits $e^i{}_1$ is corrected by the decoder $DE_1$ $42_1$ so as to provide the block of decoded bits $\underline{e}^i{}_1$.

stage $62_2$ acts on the subsets $B_0$ and $B_1$ of the first partitioning. The detector $63_2$ detects the bit $\hat{e}^i{}_2$ for the $i^{th}$ symbol of the block at the command of the bit $\underline{e}^i{}_1$ coming from the preceding stage $62_1$. The block of bits $\hat{e}^i{}_2$ is corrected by the decoder $DE_2$ $42_2$ so as to supply the block of decoded bits $\underline{e}^i{}_2$.

stage $62_3$ acts on the subsets $C_0$, $C_1$, $C_2$, $C_3$ of the second partitioning. The detector $63_3$ detects the bit $\hat{e}^i{}_3$ for the $i^{th}$ symbol of the block at the command of the bits $\underline{e}^i{}_1$ and $\underline{e}^i{}_2$ coming from the preceding stages $62_1$, $62_2$. The block of bits $\hat{e}^i{}_3$ is corrected by the decoder $DE_3$ $42_3$ so as to supply the decoded bits $\underline{e}^i{}_3$.

The symbol $(\hat{e}^i{}_1\hat{e}^i{}_2\hat{e}^i{}_3)$ constitutes a first estimate of the code of the $i^{th}$ symbol emitted by the block, and the symbol $(\underline{e}^i{}_1\underline{e}^i{}_2\underline{e}^i{}_3)$ constitutes a corrected decoded estimate thereof.

The blocks of input signals in phase (path I) and quadrature (path Q) arrive consecutively at the three stages through commutators $65_1$, $65_2$. The detectors $63_1$, $63_2$, $63_3$ are preferably formed by preprogrammed PROM units which store the erasure bits and the non-erased bits. In fact, since the values I and Q are digitized, all received signals can be arranged in the system of coordinates I, Q of the constellation, whether or not they are situated inside the erasure zones. It is thus sufficient, for example, to have 4 bits available for each component I and Q for distinguishing 16 levels on each axis I or Q, which renders it possible to distinguish 256 spaces in the plane of the constellation. When such a PROM memory is addressed with the values I, Q of a received symbol, the bit estimated by the stage detector may then be either the bit of the symbol of the constellation which is closest to the received symbol, if the latter is outside an erasure zone, or an erasure bit if the received symbol is inside an erasure zone. For a PSK-8 modulation, which is taken by way of example, the detector determines whether the phase spacing $\delta\theta_1$ satisfies the inequalities:

$$\pi/8 - \epsilon_1 \leq \delta\theta_1 \leq \pi/8$$

if it does not, the bit $e_1$ assigned to the estimated symbol is that of the nearest symbol,
  if it does, the bit $e_1$ assigned to the estimated symbol is erased.

$\delta\theta_1$ is the phase difference between the received symbol and the nearest symbol in $A_0$.

When the first stage has completed its action, the commutators $65_1$, $65_2$ commutate by one position and deliver the same data blocks to the next stage $62_2$. This has the same structure as that of the preceding stage $62_1$, except for the difference that it acts on the subsets of the first partitioning level $B_0$, $B_1$ and that the detector $63_2$ is validated by the output bits $\underline{e}^i{}_1$ which have been estimated by the preceding stage $62_1$. The PROMs of the stage are programmed for operating with the subsets $B_0$, $B_1$. The estimated bit $\underline{e}^i{}_1$ of the preceding stage is used at the next stage $62_2$ for determining which of the subsets $B_0$ or $B_1$ of the first partitioning level is to be selected. The same mechanism is operational for the third stage $62_3$ which acts on the subsets of the second partitioning level $C_0$, $C_1$, $C_2$, $C_3$. The detector $63_3$ is validated by $\underline{e}^i{}_1$ and $\underline{e}^i{}_2$.

Each stage thus delivers a corrected decoded block formed by bits $\underline{e}^i{}_1$, $\underline{e}^i{}_2$, $\underline{e}^i{}_3$ which are regularly stored in a linear memory 68, which thus stores the lines of the matrix G. This matrix is read column by column so as to supply a sequence of symbols, each symbol $r^i$ being formed by a bit $\underline{e}^i{}_1$, and by a bit $\underline{e}^i{}_2$, by a bit $\underline{e}^i{}_3$.

The decoders $42_1$, $42_2$, $42_3$ supply a signal FOP denoting the end of the operation of the stage. These signals arrive at a counter 69 which supplies a signal FIN when all stages have been active, which signal renders it possible on the one hand to read the memory 68 which stores the corrected decoded bits and on the other hand to write a new block into the memories $61_1$, $61_2$ situated at the input. In practice, the memories $61_1$, $61_2$ are present in duplicate so that one pair of memories can be charged while another pair is read.

Figure 7:
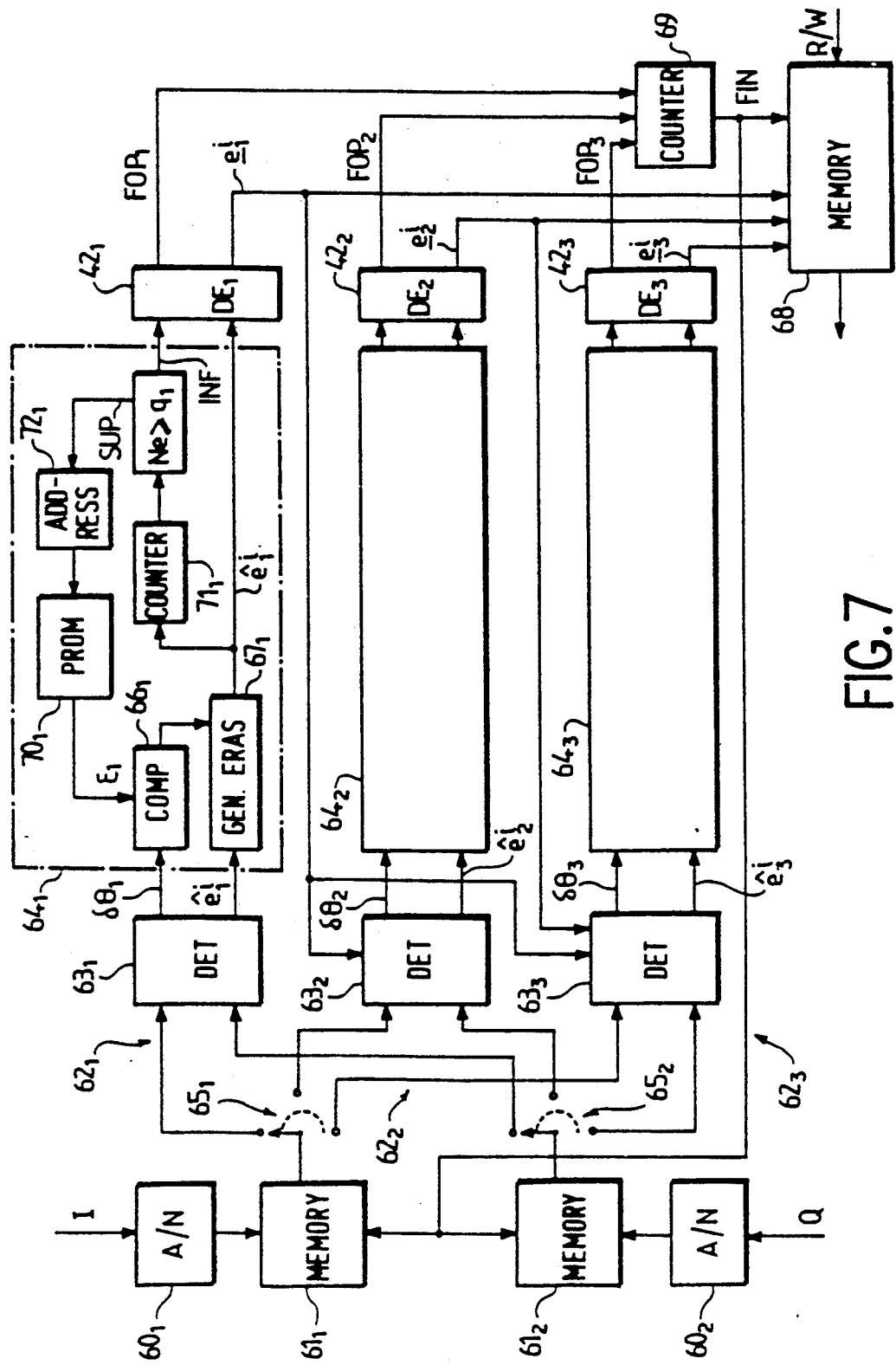
FIG. 7: a diagram of an adaptive embodiment of a multistage decoder.

The stages may operate with erasure zones which have a predetermined and fixed width for each stage, as was explained above. According to an adaptive embodiment of the invention, however, it is alternatively possible to provide an adaption possibility for the zone widths. According to the diagram of FIG. 7, this adaption is made starting from a count of the number of bits erased in a block.

For the first stage $62_1$, the input blocks arrive successively at a detector $63_1$ which supplies a phase spacing $\delta\theta_1$ and an estimate $ê^i_1$ for each of the received symbols. The estimate $ê^i_1$ corresponds to the bit $e^i_1$ of a symbol belonging to the constellation processed by the stage $62_1$, which symbol is estimated to be that which is closest to the symbol received by the detector $63_1$. The phase spacing $\delta\theta_1$ is defined between the phase of the received symbol and the phase of this estimated symbol. The detector $63_1$ is preferably formed by a preprogrammed PROM. The values I and Q being digitized, all received coded signals situated inside erasure zones can be given the corresponding references in the constellation or in the subsets. The phase spacing $\delta\theta_1$ is compared with a phase spacing $\epsilon_1$, which defines the erasure zones, by a comparator $66_1$. It is possible in this way to determine whether the estimated symbol lies inside or outside an erasure zone. If it lies inside, the comparator $66_1$ gives a command to an erasure generator $67_1$ to erase the estimated bit $ê^i_1$. The erasure generator $67_1$ receives the blocks of estimated bits $ê^i_1$ in succession and supplies blocks of estimated bits including erased bits. An erasure counter $71_1$ counts the number of bits NE which have been erased in a block of symbols. The object of this is to prevent that blocks of bits containing a total number of erasure bits in excess of the correction capacity of the decoder $42_1$ should be supplied to this decoder. To this end, the number of erased bits NE is compared with a predetermined number for each stage, for example, q1. If NE is lower than q1, a signal INF enables the decoder $42_1$ which then acts on the block as it was delivered by the erasure generator $67_1$. If NE is higher than q1, a signal SUP activates an address generator $72_1$ which addresses a new spacing $\epsilon_1$ (defining a new erasure zone of different dimensions), loaded into a PROM $70_1$, which transmits it to the comparator $66_1$. The PROm $70_1$ may thus contain several phase spacing values $\epsilon$ which may be addressed in succession.

In the case of PSK modulation, it is also possible to take into account erasure zones which are not defined by phase differences. This may relate to both the adaptive mode and the non-adaptive mode. This may be the case, for example, for a stage acting on a high partitioning level as shown in FIG. 5C where the zone distinction by angular sector is not applicable. In fact, it has proved more effective to define the erasure zones of the second partitioning level in the form of bands. Since the values I, Q are digitized, the codes of all received symbols lying within an erasure zone are known. It is possible to assign to each of these codes a value of a given parameter. Thus, if a received point lies at S (FIG. 5C, subset $C_1$) the distance OP=1 is stored in the PROM for this point S, P being the projection of the point S on the axis interconnecting the two points of the subset $C_1$. In this case, the detector $63_3$ (FIGS. 6, 7) supplies a distance data 1 and the estimated bit $ê^i_3$:

if $1<a$, erasure will take place, if $1 \geq a$, there will be no change in the bit.

Figure 8:
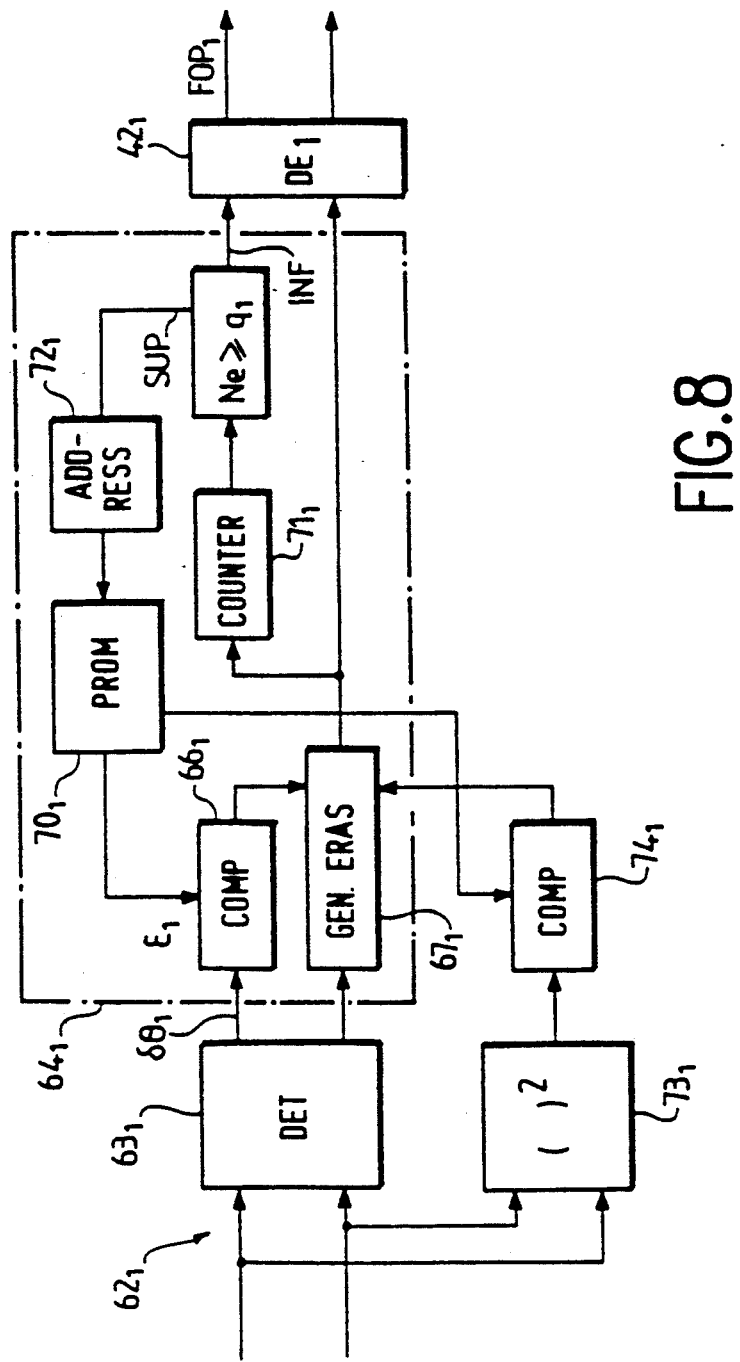
FIG. 8: a diagram of a portion of a stage with amplitude detection in an adaptive embodiment.
Figure 9:
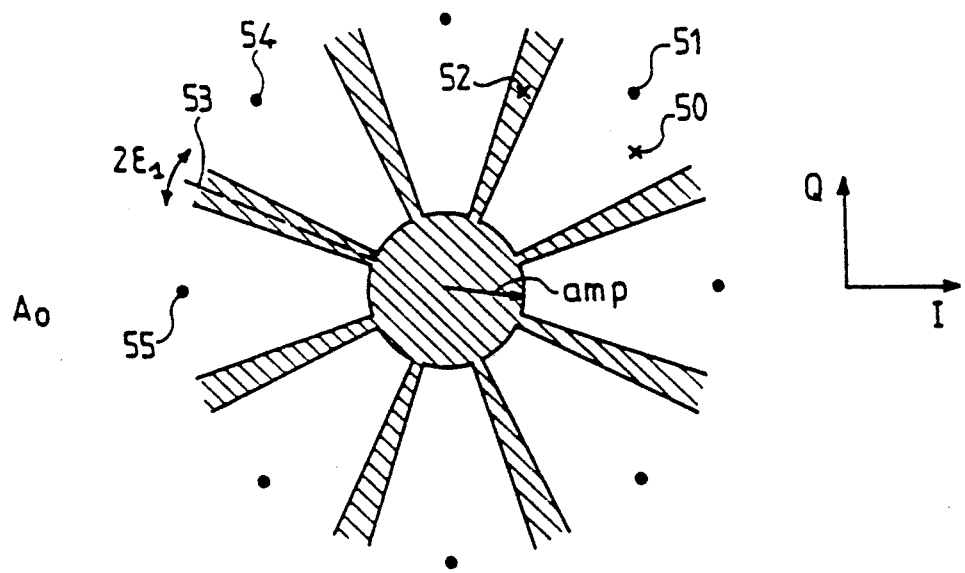
FIG. 9: a diagram of a constellation $A_0$ of a PSK-8 with erasure zones defined by phase and amplitude spacings.

In the adaptive mode, it is also possible to consider the amplitude of the received signal in addition to a phase spacing $\delta\theta$ or a distance 1 so as to take into account the problems of signal fading. In that case, a supplementary erasure zone is added formed by a circular zone which surrounds the origin at a given amplitude boundary. This is shown in FIG. 9 where the erasure zones are shown hatched. To take into account the amplitude, the decision means then comprise (FIG. 8) a device $73_1$ which calculates the square $A^2$ of the amplitude in such a way that $A^2 = I^2 + Q^2$, with I: signal in phase, Q: signal in quadrature. The amplitude $A^2$ is compared with the square of a boundary amplitude (amp) in a comparator $74_1$. This boundary amplitude may be previously determined and loaded into a memory, for example, into the PROM $70_1$ and transmitted from there to the comparator $74_1$. The comparators $66_1$ and $74_1$ determine the situations which render the creation of the erasure bits by the erasure generator $67_1$ necessary. The amplitude amp may be adapted.

Figure 10A:
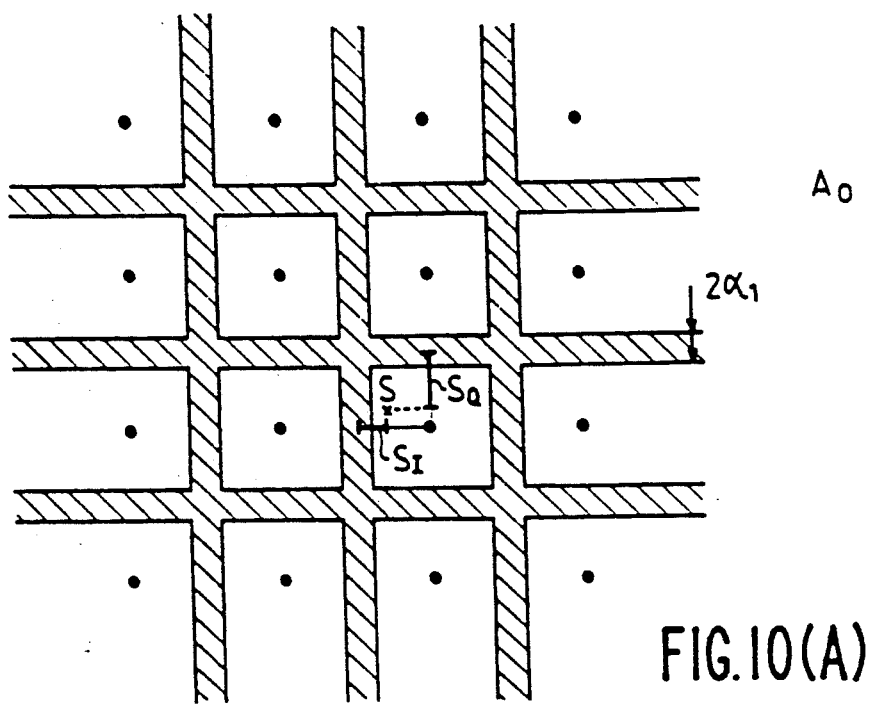
FIGS. 10A, 10B: a diagram of a constellation of a QAM-16 and of the subset $B_0$ with erasure zones.
Figure 10B:
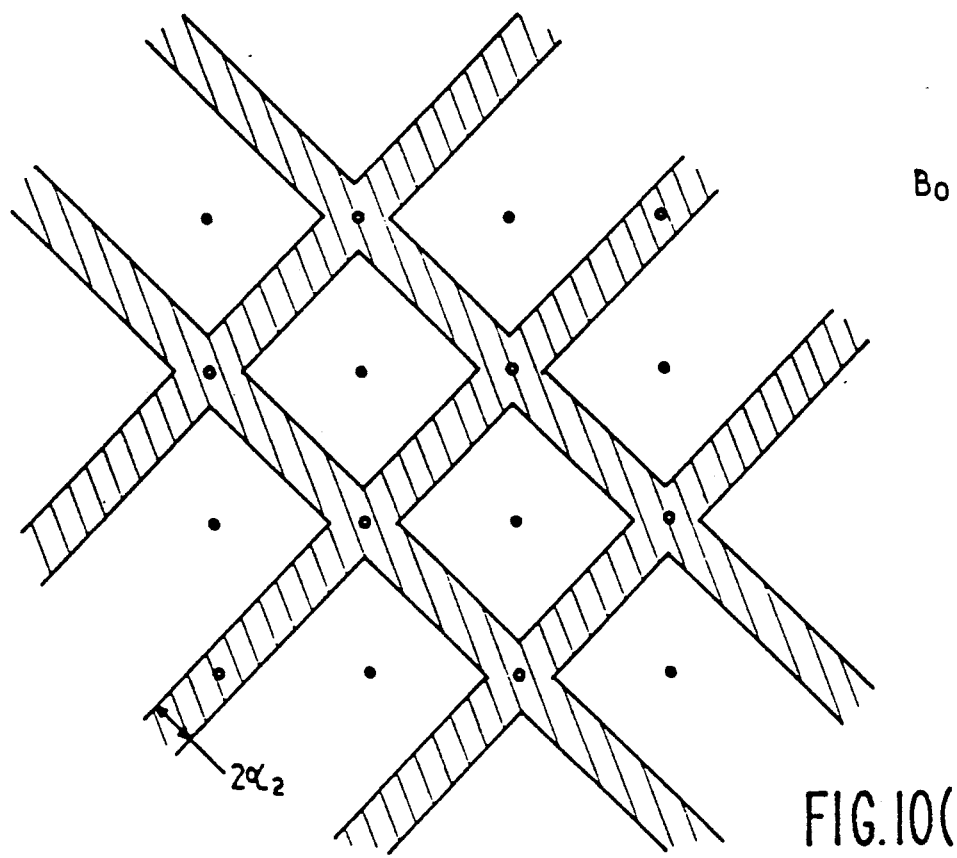

The above description relates to an 8-stage phase modulation, PSK-8. However, the invention also relates to other types of modulation. For example, FIGS. 10A and 10B show the constellation $A_0$ and the subset $B_0$ of a phase and amplitude modulation, QAM-16. In this case, the erasure zones are united and form one single erasure zone. The said erasure zones are shown hatched in FIGS. 10A, 10B. If a received point lies in these zones, the corresponding bit processed by the stage in question is erased. If a received point lies in the non-hatched zones, the said corresponding bit processed by the stage in question is preserved in the way in which it was estimated by the stage detector. In the non-adaptive mode, the detectors $63_1$, $63_2$, $63_3$ of FIG. 6 store the estimated bits (erased or not erased) corresponding to the codes of the erasure zones, as before. In the adaptive mode with QAM-16, the detectors $63_1$, $63_2$, $63_3$ of FIG. 7 no longer supply a phase information $\delta\theta$, but two distance informations $S_I$ and $S_Q$ relating to a phase component and a quadrature component of the signal. Thus in FIG. 10A, if a received symbol lies in S, each detector, for example $63_1$, supplies $S_I$ and $S_Q$. The distances are then compared with the half-distance $\alpha_1$ for determining whether the received symbol is in the erasure zone. This possibly renders necessary the carrying out of two successive comparisons per stage. These are made either by the comparator $66_1$ acting twice in succession, or by doubling the number of comparators. If the first comparator detects a distance smaller than $\alpha_1$, the second comparison is redundant since the received point is then situated in an erasure zone. The adaptation mechanism operates in the same manner as that which has already been described. If the number of erasures is too high, the value of the distance $\alpha_1$ is reduced through reading of a different value $\alpha'_1$ previously stored in the PROM.

FIG. 10B shows the subset $B_0$ of the first partitioning level of a QAM-16 constellation. The dots represent the states of this subset $B_0$. The small circles indicate the states which do not belong to this subset $B_0$. The width of the erasure zones is $2\alpha_2$.

Figure 11:
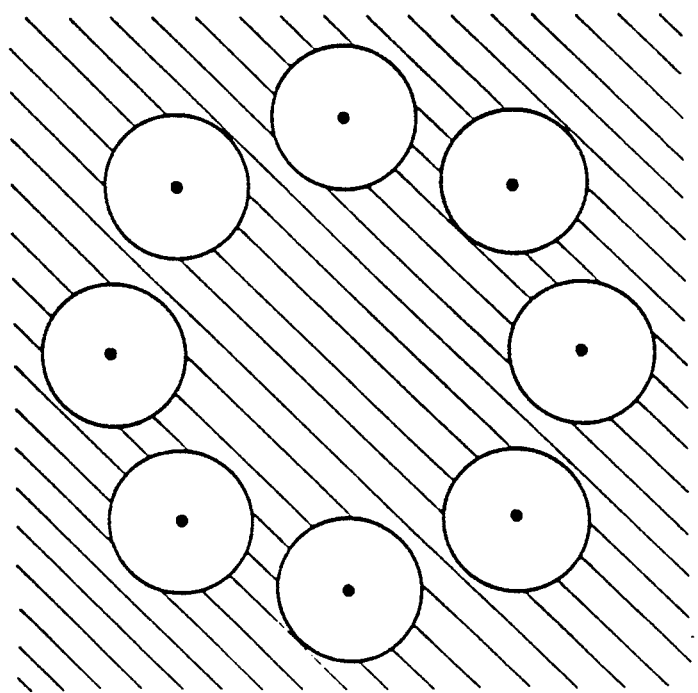
FIG. 11: a diagram of a PSK-8 constellation in which the erasure zones are defined by a degree of distance.

In the example given above, the zones which do not give rise to erasure have a square or rectangular shape around states of the subset of the partitioning level in question. These erasure zones, however, may have alternative shapes, for example circular, without departing from the scope of the invention. This is shown in FIG. 11 for the case of a PSK-8 constellation.

We claim:

1. A multistage decoder for decoding received symbols coded into blocks formed by symbols which are consecutively emitted after having undergone a multilevel coding according to several successive partitioning levels from a constellation into several subsets during an emission, a symbol of the constellation being coded by means of several bits, while each stage of the multistage decoder determines a sequence of bits relative to a partitioning level for a sequence of estimated symbols which are selected from among the symbols of the constellation or the subset as being each individually the closest to the received symbols, a first stage of said multistage decoder comprising decision means coupled to a stage decoder, wherein said decision means comprises means for generating erasure bits for the estimated symbols whenever a received symbol is situated in a predetermined erasure zone in relation to the subset considered by the relevant stage, and said stage decoder comprises correcting means for correcting the erasure bits and any error bits present so as to deliver corrected decoded blocks.

2. A multistage decoder as claimed in claim 1 wherein the decision means comprises a memory which is programmed so as to assign to the estimated symbol:
    either the erasure bit,
    or the bit of the symbol closest to the received symbol, depending on whether the received symbol is or is not situated in an erasure zone.

3. A multistage decoder as claimed in claim 1, wherein the decision means comprise:
    a detector which supplies a bit of a first estimated symbol for a first received symbol,
    a comparator which compares the position of said first estimated symbol with at least one boundary position which defines the erasure zones,
    an erasure generator
        which erases the bit of the first estimated symbol when the first estimated symbol is inside an erasure zone, and
        which maintains the bit of said first estimated symbol when the said first estimated symbol is outside an erasure zone,
    a counter which counts the number NE of erasure bits of a block of estimated bits,
    an adaptation member which, if the number NE is higher than a limit value, modifies the boundary position of the comparator so as to reduce the width of the erasure zones, and which maintains the boundary position in the opposite case.

4. A multistage decoder as claimed in claim 3, wherein the boundary position is given by a boundary phase spacing $2\epsilon$, the predetermined erasure zone of a subset being formed by angular erasure sectors defined by a phase spacing $\delta\theta$ around the phase angles corresponding to bisectors which separate every two adjoining states of the said partitioning from one another in the constellation or the subsets.

5. A multistage decoder as claimed in claim 3 wherein the erasure zone of the constellation or of a first subset are formed by erasure bands of a width centred on the centrelines which separate the most closely adjoining symbols two by two from one another.

6. A multistage decoder for decoding PSK signals as claimed in claim 4, wherein at least one stage operates with angular erasure sectors and at least one other stage operates with erasure bands.

7. A multistage decoder for decoding PSK signals as claimed in claim 4, wherein at least one stage operates simultaneously with angular erasure sectors and with an erasure zone of constant amplitude centred on the origin.

8. A multistage decoder as claimed in claim 4, wherein the erasure zone of the constellation or of a subset are formed by erasure bands of a first width centered on the centrelines which separate the most closely adjoining symbols two by two from one another.

9. A multistate decoder for decoding PSK signals as claimed in claim 5, wherein at least one stage operates with angular erasure sectors and at least one other stage operates with erasure bands.

10. A multistage decoder for decoding PSK signals as claimed in claim 8, wherein at least one stage operates with angular erasure sectors and at least one other stage operates with erasure bands.

11. A multistage decoder for decoding PSK signals as claimed in claim 5, wherein at least one stage operates simultaneously with angular erasure sectors and with an erasure zone of constant amplitude centered on the origin.

12. A multistage decoder for decoding PSK signals as claimed in claim 8, wherein at least one stage operates simultaneously with angular erasure sectors and with an erasure zone of constant amplitude centered on the origin.

* * * * *